United States Patent
Huang

(12) United States Patent (10) Patent No.: US 7,061,026 B2
(45) Date of Patent: Jun. 13, 2006

(54) HIGH BRIGHTNESS GALLIUM NITRIDE-BASED LIGHT EMITTING DIODE WITH TRANSPARENT CONDUCTING OXIDE SPREADING LAYER

(75) Inventor: Wen-Chieh Huang, Dashi (TW)

(73) Assignee: Arima Optoelectronics Corp., Taoyuan (TW)

( * ) Notice: Subject to any disclaimer, the term of this patent is extended or adjusted under 35 U.S.C. 154(b) by 168 days.

(21) Appl. No.: 10/825,290

(22) Filed: Apr. 16, 2004

(65) Prior Publication Data

US 2005/0230701 A1   Oct. 20, 2005

(51) Int. Cl.
*H01L 33/00* (2006.01)

(52) U.S. Cl. .............................. 257/103; 257/81; 257/99

(58) Field of Classification Search ...................... None
See application file for complete search history.

(56) References Cited

U.S. PATENT DOCUMENTS 6,569,548 B2 * 5/2003 Yamamoto et al. .......... 428/702
2005/0082558 A1 * 4/2005 Yang et al. .................. 257/97

* cited by examiner

*Primary Examiner*—Tu-Tu Ho
(74) *Attorney, Agent, or Firm*—Rosenberg, Klein & Lee

(57) ABSTRACT

A new transparent conducting oxide (TCO), which can be expressed as $Al_xGa_{3-x-y}In_{5+y}Sn_{2-z}O_{16-2z}$; $0 \leq x < 1$, $0 < y < 3$, $0 \leq z < 2$, has been used to improve the brightness and current spreading in GaN base LED process. The optical properties of this system are superior to regular Ni/Au transparent conducting layer in blue-green region, and the new $Al_2O_3$—$Ga_2O_3$—$In_2O_3$—$SnO_2$ system is able to increase the brightness at 1.5~2.5 time to compare to regular process. Furthermore, the new transparent conducting oxide thin film has the highest conductivity, which is better than the Ni/Au transparent conducting thin film.

18 Claims, 7 Drawing Sheets

X : 0.5 V/Div
Y : 0.2 mA/Div

X : 0.5 V/Div
Y : 0.2 mA/Div

X : 0.5 V/Div
Y : 0.2 mA/Div

HIGH BRIGHTNESS GALLIUM NITRIDE-BASED LIGHT EMITTING DIODE WITH TRANSPARENT CONDUCTING OXIDE SPREADING LAYER

BACKGROUND OF THE INVENTION

1. Field of the Invention

The present invention relates to the field of transparent conducting oxide (TCO) and solid-state Gallium Nitride-based light-emitting devices.

2. Description of the Related Art

In recent years, the p-type Gallium Nitride-based III-V group compound semiconductor layer usually has a carrier concentration of less than $1 \times 10^{18}$ cm$^{-3}$, and the lowest resistivity is no lower than 1 ohm-cm. Such poor conductivity cannot effectively distribute the current to the entire p-type compound semiconductor layer. Therefore, the p-electrode is usually formed to cover substantially entire surface of the p-type Gallium Nitride-based III-V group compound semiconductor layer in order to ensure the uniform spreading of current to the entire p-type compound semiconductor layer, thereby obtaining uniform light emission from the device. However, the p-electrode considered being a light transmitting and ohmic electrode.

Due to the end of 1993, the Nichia Chemical Industries Ltd. in Japan announced the successful fabrication of the solid-state Gallium Nitride-based light-emitting devices that employed the metallic thin film as the p-electrode. Also, Nichia Chemical Industries Ltd. in Japan announces a particularly preferable metallic thin film contains gold and nickel. Gold and nickel are preferable formed such that a layer of nickel is formed in direct contact with the p-semiconductor layer and a layer of gold is formed on the nickel layer. After an annealing treatment, such a multi-layered structure can form an alloy, which is light transmitting and ohmic to p-type Gallium Nitride-based III-V group compound semiconductor layer.

The prior art shown in FIG. 1, the Nichia Chemical Industries Ltd disclosed in U.S. Pat. No. 6,093,965 that the Gallium Nitride-based III-V group compound semiconductor uses a sapphire substrate 116, an n-type Gallium Nitride-based cladding layer 15, an n-type Titanium/Aluminum (Ti/Al) electrode bonding pad 14, an Indium-Gallium Nitride system light emitting layer 13, a p-type Gallium Nitride-based cladding layer 12, a p-type metallic thin film contains Nickel-Gold (Ni/Au) light transmitting electrode 11A and a p-type Nickel-Gold (Ni/Au) electrode bonding pad 10.

A metallic thin film contains Nickel-Gold (Ni/Au) light transmitting electrode usually transmits 20 to 40% of the light emitted from device there through. Therefore, to improve the brightness and efficiency of the Gallium Nitride-based III-V group compound semiconductor light emitting device is to reduce the absorption from the light transmitting electrode.

Tin indium oxide has been used to be the light transmitting electrode to reduce the absorption from regular nickel-gold thin film light transmitting electrode as shown in FIG. 2, the Indium Gallium Nitride light emitting diode uses a sapphire substrate 116, an n-type Gallium Nitride-based cladding layer 15, an n-type Aluminum Gallium Nitride-based cladding layer 15A, an n-type Titanium/Aluminum (Ti/Al) electrode bonding pad 14, an Indium-Gallium Nitride system light emitting layer 13, a p-type Gallium Nitride-based cladding layer 12, a p-type high concentration contact layer 117, an Indium-Tin Oxide (ITO) light transmitting electrode 11C and a p-type Nickel-Gold (Ni/Au) electrode bonding pad 10.

A Gallium Nitride-based contact layer with a p-type concentration of greater than $5 \times 10^{18}$ cm$^{-3}$ and a thickness of less than 500 Angstroms. The contact layer 117 can be formed by Zinc (Zn) diffusion, Magnesium (Mg) diffusion, Zn or Mg ion implantation, etc., and the Epistar Co. uses Indium-Tin Oxide (ITO) to be the light transmitting electrode to improve the light efficiency. Usually, the light emitting diode of using this technique can only transmits 50 to 70% of the light emitted from light through the high concentration of p-type contact layer 117 by Zn, Mg diffusion or implantation process and ITO light transmitting electrode 11C. Furthermore, In ITO film, charge carriers are from both Tin dopant and ionized oxygen vacancy donors. The humidity can easy diffuse into ITO film and destroy the interface between ITO film and Gallium Nitride-based contact layer; the contact resistivity of ohmic contact will increase a lot. So, it is unstable and unreliable in high humidity condition.

In the prior art, no light transmitting electrode has the light efficiency and good reliability at the same time for Gallium Nitride-based light emitting semiconductor device.

SUMMARY OF THE INVENTION

The present invention provides a method for producing high efficiency Gallium Nitride-based light emitting device comprising a new $Al_2O_3$—$Ga_2O_3$—$In_2O_3$—$SnO_2$ system transparent conducting oxide (TCO) such as an amorphous or nanocrystalline thin film. The new $Al_2O_3$—$Ga_2O_3$—$In_2O_3$—$SnO_2$ system thin film has the highest conductivity, which is approximately ten times higher then that observed in commercial Indium-Tin Oxide (ITO).

Another object of the present invention is to prove a Gallium Nitride-based contact layer with Gallium rich phase which can reduce the contact resistance between the Gallium Nitride-based III-V group compound semiconductor light emitting device and this new $Al_2O_3$—$Ga_2O_3$—$In_2O_3$—$SnO_2$ transparent conducting oxide system, also, this contact layer can be n-type, p-type or undoping.

Still another object of the present invention is to provide an intermediate layer which is between the p-type cladding layer and Gallium Nitride-based contact layer and the intermediate layer can be Indium Nitride-based materials and p-type, n-type or undoping. The material band-gap energy of this intermediate layer must be lower than the p-type Gallium Nitride-based cladding layer. The function of this layer is to reduce the electrical spiking effect between p-type Gallium Nitride-based cladding layer and Gallium Nitride-based contact layer with Gallium rich phase.

According to the first present invention, a high brightness Gallium Nitride-based light emitting semiconductor device can be produced by forming an $Al_2O_3$—$Ga_2O_3$—$In_2O_3$—$SnO_2$ system light transmitting layer in contact with the p-type Gallium Nitride-based cladding layer. To anneal the $Al_2O_3$—$Ga_2O_3$—$In_2O_3$—$SnO_2$ system light transmitting layer which establishing an ohmic contact with the p-type Gallium Nitride-based cladding layer. Moreover, a transparent conducting oxide window layer can be shaped in contact with this light transmitting layer to improve the light efficiency and current spreading.

According to the second present invention, a high brightness Gallium Nitride-based light emitting semiconductor device can be produced by growing a layer of Gallium Nitride-based contact layer with Gallium rich phase in between the p-type Gallium Nitride-based cladding layer and the $Al_2O_3$—$Ga_2O_3$—$In_2O_3$—$SnO_2$ system light transmitting layer. To annealing this high brightness Gallium Nitride-based light emitting semiconductor device at high temperature, which forming a firm interface between the $Al_2O_3$—$Ga_2O_3$—$In_2O_3$—$SnO_2$ system light transmitting layer and Gallium Nitride-based contact layer. This interface can reduce the contact resistivity of ohmic contact and improving the light efficiency. Furthermore, this firm interface as well can improve the reliability of contact resistivity of ohmic contact.

According to the third present invention, an intermediate layer which is in between the p-type cladding layer and Gallium Nitride-based contact layer and the intermediate layer can be Indium Nitride-based materials and p-type, n-type or undoping, the material band-gap energy of this intermediate layer must be lower than the p-type Gallium Nitride-based cladding layer. To low down the band-gap energy in between a p-type Gallium Nitride-based cladding layer and a Gallium Nitride-based contact layer, which form a good function to reduce the electrical spiking effect while current cross a p-type Gallium Nitride-based cladding layer and a Gallium Nitride-based contact layer.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF THE PREFERRED EMBODIMENTS

To prepare the samples under the same thickness condition of an Indium-Tin Oxide (ITO), $Ga_{1.6}In_{6.4}Sn_2O_{16}$, $Ga_{2.8}In_{5.2}Sn_2O_{16}$ and $Al_{0.1}Ga_{2.7}In_{5.2}Sn_2O_{16}$ transparent conducting oxides. The color of the $Al_2O_3$—$Ga_2O_3$—$In_2O_3$—$SnO_2$ system samples ranged from light blue-green (slight Aluminum content) to light green (high Gallium content) to green (low Gallium content). The color of a polycrystalline Indium-Tin Oxide (ITO) sample was also green, but dark than any of the $Al_2O_3$—$Ga_2O_3$—$In_2O_3$—$SnO_2$ system samples.

Figure 9:
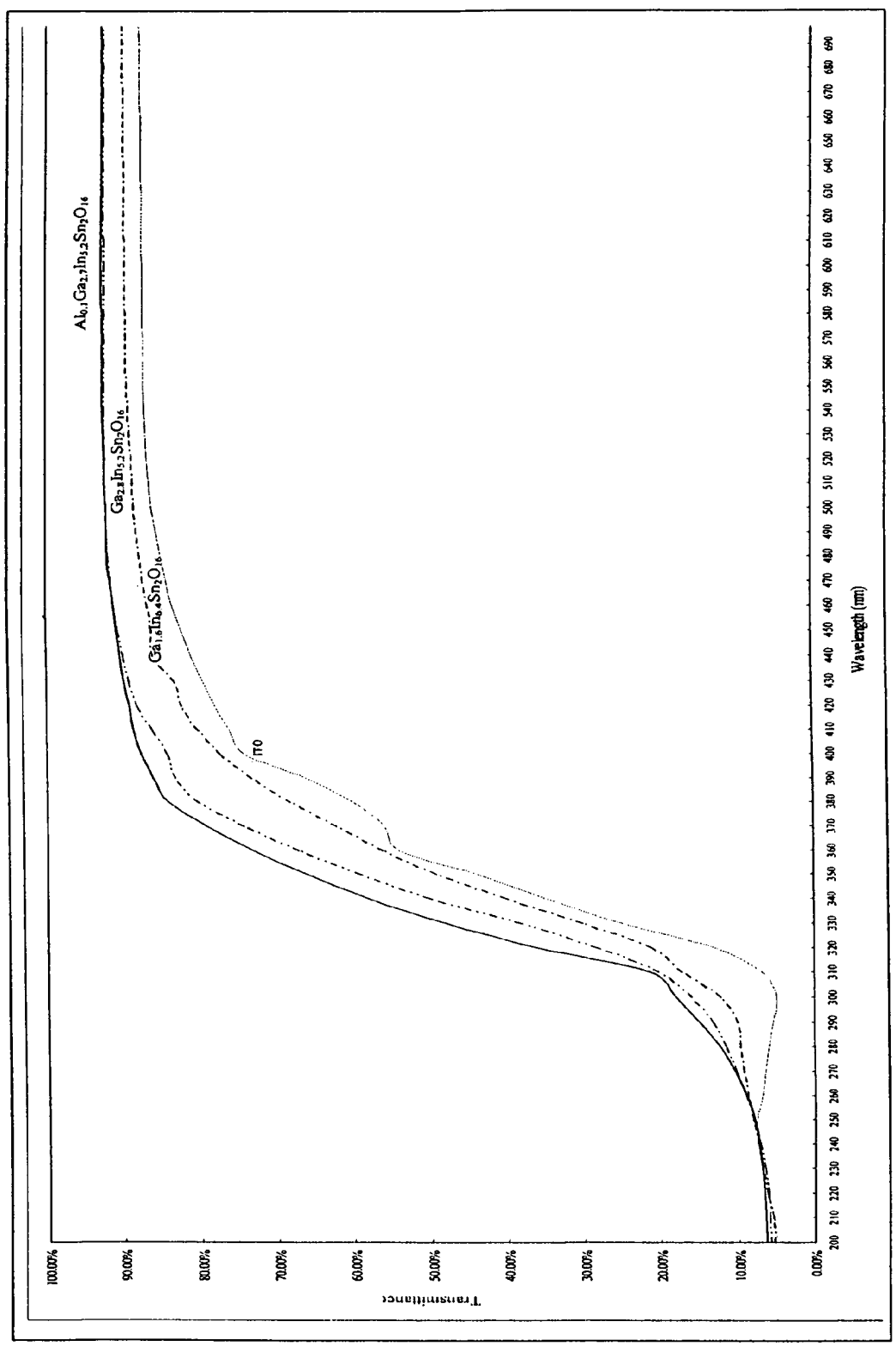
FIG. 9 is a graph showing a transmittance spectra (UV-V is region) of ITO, $Ga_{1.6}In_{6.4}Sn_2O_{16}$, $Ga_{2.8}In_{5.2}Sn_2O_{16}$ and $Al_{0.1}Ga_{2.7}In_{5.2}Sn_2O_{16}$.

FIG. 9 compares the transmittance spectra (UV-V is region) of ITO, $Ga_{1.6}In_{6.4}Sn_2O_{16}$, $Ga_{2.8}In_{5.2}Sn_2O_{16}$ and $Al_{0.1}Ga_{2.7}In_{5.2}Sn_2O_{16}$. Transmittances of the $Al_xGa_{3-x-y}In_{5+y}Sn_{2-z}O_{16-2z}$ compositions are slightly superior to Indium-Tin Oxide (ITO) at wavelength ($\lambda$)>400 nm, in addition, the $Al_xGa_{3-x-y}In_{5+y}Sn_{2-z}O_{16-2z}$ composition have a lower absorption at UV region. The present invention shows, increasing the Gallium concentration or slight Aluminum concentration to $Al_xGa_{3-x-y}In_{5+y}Sn_{2-z}O_{16-2z}$ compositions, which can have higher transmission in blue-green region.

The transmission property of transparent conducting oxide is determined by material band gap at lower wavelength limit:

$$\lambda_{bg} = hc/E_g,$$

and upper wavelength limit is determined by charge carrier density:

$$\lambda_p = 2\pi[mc^2/4\pi(N/V)e^2]^{1/2},$$

Also, material defect density and phase relation determine the transmission property of transparent conducting oxide material. In the present invention of $Al_xGa_{3-x-y}In_{5+y}Sn_{2-z}$ $O_{16-2z}$ composition, when the Aluminum concentration is increasing to x>1, the transmittance of $Al_xGa_{3-x-y}In_{5+y}Sn_{2-z}O_{16-2z}$ composition is decay tremendously.

The $Al_xGa_{3-x-y}In_{5+y}Sn_{2-z}O_{16-2z}$ composition, where x>1, the sheet resistance is increasing and the carriers concentration is decreasing a lot, from this invention result, if the Aluminum concentration is too high in the $Al_xGa_{3-x-y}In_{5+y}Sn_{2-z}O_{16-2z}$ composition, the defect density will increase and the monoclinic β-Gallia phase structure will be destroyed by rising Aluminum concentration to over x>1 in the $Al_xGa_{3-x-y}In_{5+y}Sn_{2-z}O_{16-2z}$ composition. The preferred consist of $Al_2O_3$—$Ga_2O_3$—$In_2O_3$—$SnO_2$ system may be represented by the formula:

$$Al_xGa_{3-x-y}In_{5+y}Sn_{2-z}O_{16-2z}$$

where $0 \leq x < 2$, $0 < y < 3$, $0 \leq z < 2$.

Furthermore, in present invention, the $Al_xGa_{3-x-y}In_{5+y}Sn_{2-z}O_{16-2z}$ have a tetragonal structure phase in which Sn is incorporated as a structural element rather than as a substitution dopant as it is in Indium-Tin Oxide (ITO). For this reason, the new $Al_2O_3$—$Ga_2O_3$—$In_2O_3$—$SnO_2$ system has more stable and reliable in comparison to Indium-Tin Oxide (ITO).

Figure 10:
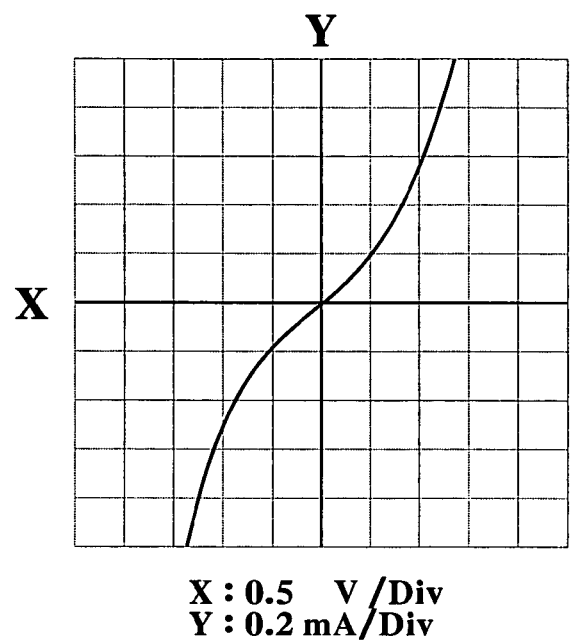
FIG. 10 is a graph showing a current-voltage characteristic of an $Al_2O_3$—$Ga_2O_3$—$In_2O_3$—$SnO_2$ system light transmitting electrode in contact with the p-type Gallium Nitride-based cladding layer of the invention, wherein one division of X axis is 0.5 V, and one division of Y axis is 0.2 mA.

In present invention, the light transmitting layer of $Al_2O_3$—$Ga_2O_3$—$In_2O_3$—$SnO_2$ system has to be deposited in contact with the p-type Gallium Nitride-based cladding layer and annealing at a temperature 200° C. or more. There still have a shocky barrier and formed a poor ohmic contact between the light transmitting electrodes of $Al_2O_3$—$Ga_2O_3$—$In_2O_3$—$SnO_2$ system and p-type Gallium Nitride-based cladding layer. FIG. 10 shows a current-voltage characteristic of an $Al_2O_3$—$Ga_2O_3$—$In_2O_3$—$SnO_2$ system light transmitting layer in contact with the p-type Gallium Nitride-based cladding layer of the invention.

In present invention, to consider the conductivity of light transmitting layer of $Al_2O_3$—$Ga_2O_3$—$In_2O_3$—$SnO_2$ system, the thickness must over 5 Angstroms.

Figure 11:
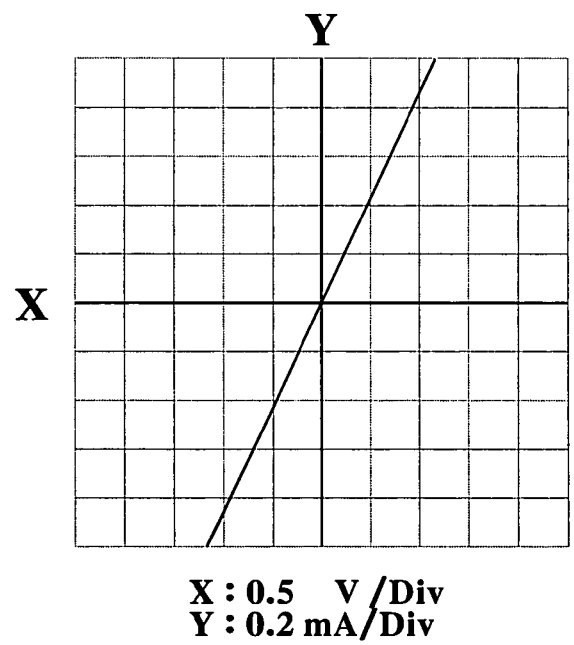
FIG. 11 is a graph showing a current-voltage characteristic of a Gallium Nitride-based contact layer with Gallium rich phase in between the p-type Gallium Nitride-based cladding layer and the $Al_2O_3$—$Ga_2O_3$—$In_2O_3$—$SnO_2$ system light transmitting electrode of the invention, wherein one division of X axis is 0.5 V, and one division of Y axis is 0.2 mA.

In present invention, to grow a Gallium Nitride-based contact layer with Gallium rich phase in between the p-type Gallium Nitride-based cladding layer and the $Al_2O_3$—$Ga_2O_3$—$In_2O_3$—$SnO_2$ system light transmitting layer, and annealed at a temperature 200° C. or more, the Gallium of a Gallium Nitride-based contact layer with Gallium rich phase is partially diffused into the $Al_xGa_{3-x-y}In_{5+y}Sn_{2-z}O_{16-2z}$ light transmitting layer, and formed a preferable high Gallium content of $Al_xGa_{3-x-y}In_{5+y}Sn_{2-z}O_{16-2z}$ interface, and establishes a good ohmic contact with a Gallium Nitride-based contact layer, and the thickness of this Gallium Nitride-based contact layer is between 5 Angstroms to 1000 Angstroms. A current-voltage characteristic of a Gallium Nitride-based contact layer with Gallium rich phase in between the p-type Gallium Nitride-based cladding layer and the $Al_2O_3$—$Ga_2O_3$—$In_2O_3$—$SnO_2$ system light transmitting layer is shown in FIG. 11.

The Gallium Nitride-based contact layer with Gallium rich phase has highly disorder structure in comparison to an p-type Gallium Nitride-based cladding layer, which a current cross a p-type Gallium Nitride-based cladding layer and a Gallium Nitride-based contact layer that the current spiking will appear in between two layer, and the thickness of this Indium Nitride-based intermediate layer is between 5 Angstroms to 500 Angstroms.

Figure 7:
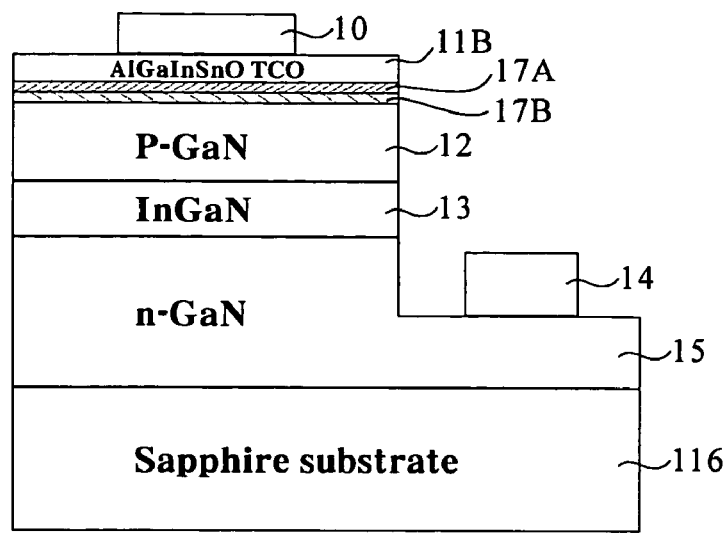
FIG. 7 is a cross-sectional view, schematically illustrating a light-emitting device according to the invention of $Al_2O_3$—$Ga_2O_3$—$In_2O_3$—$SnO_2$ system light transmitting layer 11B, Gallium Nitride-based contact layer with Gallium rich phase 17A and Indium Gallium Nitride-based intermediate layer.

FIG. 7 shows to grow a Indium Nitride-based intermediate layer 17B which is in between the p-type cladding layer 12 and Gallium Nitride-based contact layer 17B and the Indium Nitride-based intermediate layer 17B can be AlGaInN, AlInN, InGaN or InN materials and p-type, n-type or undoping, the material band-gap energy of this Indium Nitride-based intermediate layer must be lower than the p-type Gallium Nitride-based cladding layer 12.

Figure 12:
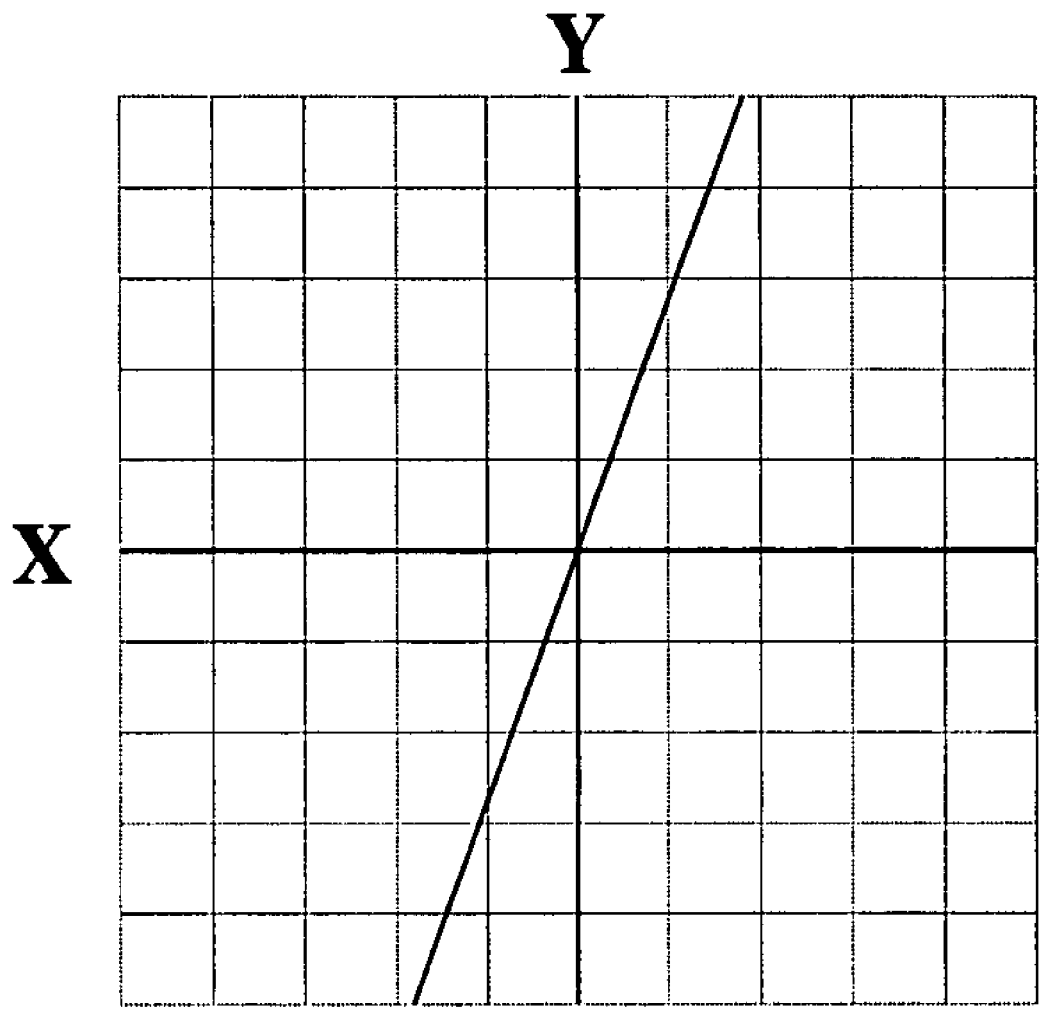
FIG. 12 is a graph showing a current-voltage characteristic of an intermediate layer which is in between the p-type cladding layer and Gallium Nitride-based contact layer of the invention, wherein one division of X axis is 0.5 V, and one division of Y axis is 0.2 mA.

FIG. 12 shows a current-voltage characteristic of the lower material band-gap energy of a Indium Nitride-based intermediate layer between a p-type Gallium Nitride-based cladding layer and a Gallium Nitride-based contact layer, which come out a good function to reduce the electrical spiking effect in which current cross a p-type Gallium Nitride-based cladding layer and a Gallium Nitride-based contact layer.

Figure 1:
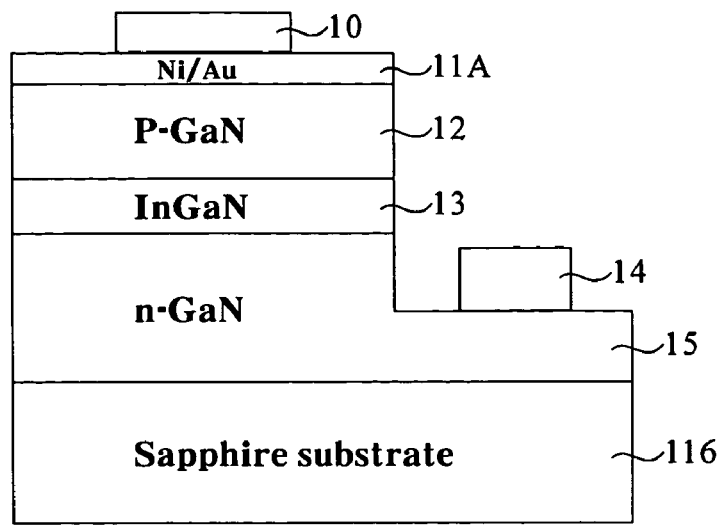
FIG. 1 is a cross-sectional view, schematically illustrating a light-emitting device according to a prior art with a metallic light transmitting electrode in contact with the p-type Gallium Nitride-based cladding layer.
Figure 2:
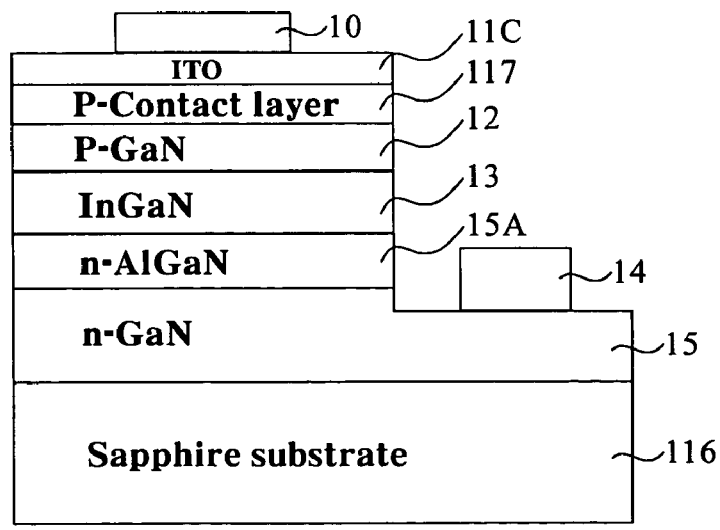
FIG. 2 is a cross-sectional view, schematically illustrating a light-emitting device according to a prior art with an Indium-Tin Oxide (ITO) light transmitting layer in contact with the p-type Gallium Nitride-based cladding layer.
Figure 3:
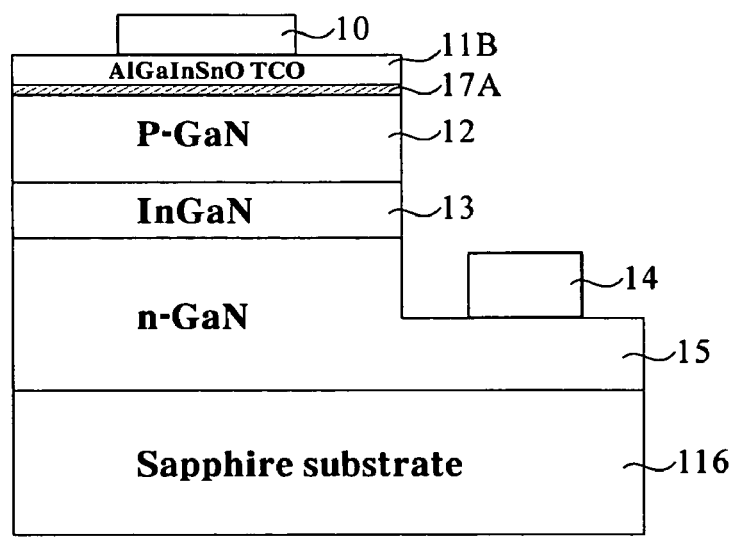
FIG. 3 is a cross-sectional view, schematically illustrating a light-emitting device according to the invention of $Al_2O_3$—$Ga_2O_3$—$In_2O_3$—$SnO_2$ system light transmitting layer 11B and Gallium Nitride-based contact layer with Gallium rich phase 17A on sapphire substrate.

FIG. 3 schematically shows an embodiment of the light-emitting device according to the invention of $Al_2O_3$—$Ga_2O_3$—$In_2O_3$—$SnO_2$ system light transmitting layer 11B and Gallium Nitride-based contact layer with Gallium rich phase 17A on a transparent insulating substrate 116, such as $Al_2O_3$, $LiGaO_2$, $LiAlO_2$ and $MgAl_2O_4$. And an n-type GaN as a first lower cladding layer 15 directly over said transparent insulating substrate 116, an InGaN light-emitting layer 13 directly over said lower cladding layer 15, a p-type GaN as second upper cladding layer 12 directly over said light-emitting layer 13, an n-type electrode 14 formed on the partially exposed area of the n-type GaN 15, a p-type electrode 10 formed on top of the light transmitting layer 11B.

Figure 4:
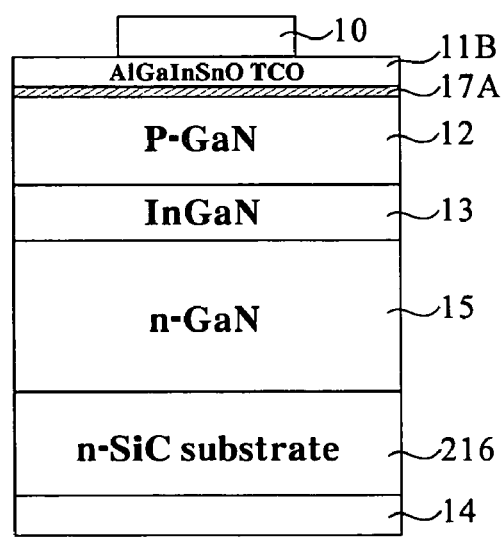
FIG. 4 is a cross-sectional view, schematically illustrating a light-emitting device according to the invention of $Al_2O_3$—$Ga_2O_3$—$In_2O_3$—$SnO_2$ system light transmitting layer 11B and Gallium Nitride-based contact layer with Gallium rich phase 17A on a silicon carbide (SiC) 216 substrate.

FIG. 4 schematically shows an embodiment of the light-emitting device according to the invention of $Al_2O_3$—$Ga_2O_3$—$In_2O_3$—$SnO_2$ system light transmitting layer 11B and Gallium Nitride-based contact layer with Gallium rich phase 17A on a transparent and electrically conducting substrate 216, such as silicon carbide (SiC), Gallium Nitride-based (GaN) and Aluminum Nitride-based (AlN) substrate. The difference between this structure and that of FIG. 3 is that an n-type electrode 14 formed underneath the conductivity type substrate 216.

Figure 5:
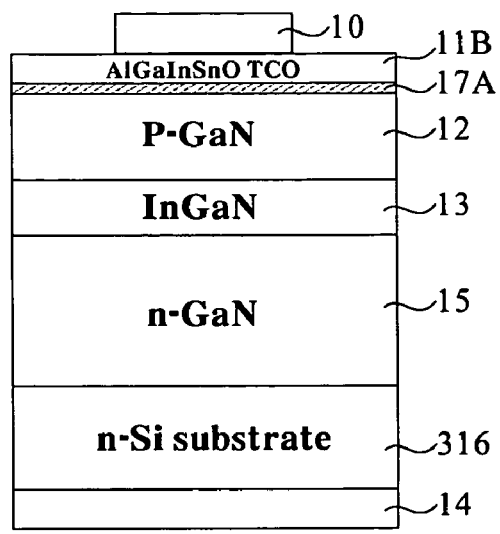
FIG. 5 is a cross-sectional view, schematically illustrating a light-emitting device according to the invention of $Al_2O_3$—$Ga_2O_3$—$In_2O_3$—$SnO_2$ system light transmitting layer 11B and Gallium Nitride-based contact layer with Gallium rich phase 17A on a silicon (Si) 316 substrate.

FIG. 5 schematically shows an embodiment of the light-emitting device according to the invention of $Al_2O_3$—$Ga_2O_3$—$In_2O_3$—$SnO_2$ system light transmitting layer 11B and Gallium Nitride-based contact layer with Gallium rich phase 17A on a silicon (Si) 316 substrate or ZnSe substrate.

Figure 6:
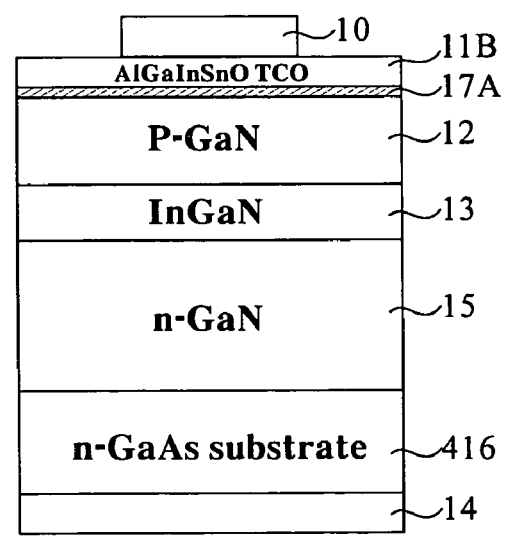
FIG. 6 is a cross-sectional view, schematically illustrating a light-emitting device according to the invention of $Al_2O_3$—$Ga_2O_3$—$In_2O_3$—$SnO_2$ system light transmitting layer 11B and Gallium Nitride-based contact layer with Gallium rich phase 17A on Gallium Arsenide-based (GaAs based) 416 substrate.

FIG. 6 schematically shows an embodiment of the light-emitting device according to the invention of $Al_2O_3$—$Ga_2O_3$—$In_2O_3$—$SnO_2$ system light transmitting layer 11B and Gallium Nitride-based contact layer with Gallium rich phase 17A on a light absorption and electrically conducting substrate 416, such as the Gallium Arsenide-based (GaAs based), Gallium phosphide-based (GaP) substrate.

Figure 8:
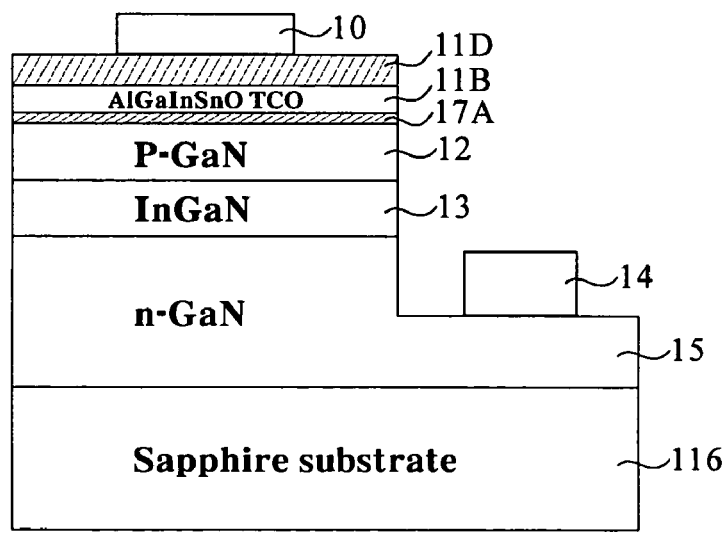
FIG. 8 is a cross-sectional view, schematically illustrating a light-emitting device according to the invention of $Al_2O_3$—$Ga_2O_3$—$In_2O_3$—$SnO_2$ system light transmitting layer 11B, Gallium Nitride-based contact layer with Gallium rich phase 17A and transparent conducting oxide window layer.

FIG. 8 schematically shows an embodiment of the light-emitting device according to the invention of $Al_2O_3$—$Ga_2O_3$—$In_2O_3$—$SnO_2$ system light transmitting layer 11B and Gallium Nitride-based contact layer with Gallium rich phase 17A and a transparent conducting oxide window layer 11D, such as $SnO_2$, $In_2O_3$, ITO, $Cd_2SnO_4$, ZnO, $CuAlO_2$, $CuGaO_2$, $SrCu_2O_2$, NiO, $AgCoO_2$, etc, can be formed in contact with this light transmitting electrode to improve the light efficiency and current spreading, and to consider the light efficiency and current spreading of transparent conducting oxide, the thickness must over 5 Angstroms.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A light emitting diode, comprising:
a transparent insulating substrate;
a first conductivity type GaN as a first lower cladding layer directly over said transparent insulating substrate;
an InGaN light-emitting layer directly over said lower cladding layer;
a second conductivity type GaN as second upper cladding layer directly over said InGaN light-emitting layer;
a GaN based contact layer with Gallium rich phase and thickness is between 5 Angstroms to 1000 Angstroms directly over said upper cladding layer;
an AlGaInSnO system transparent conducting oxide (TCO) as a light transmitting layer directly over said GaN based contact layer, and the thickness of this TCO thin film must over 5 Angstroms;
a first electrode formed on the partially exposed area of the first conductivity type GaN; and
a second electrode formed on top of the light transmitting layer.

2. A light emitting diode as recited in claim 1, wherein said transparent conducting oxide (TCO) has the composition:

$$Al_xGa_{3-x-y}In_{5+y}Sn_{2-z}O_{16-2z},$$

Where $0 \leq x < 2$, $0 < y < 3$, $0 \leq z < 2$.

3. A light emitting diode as recited in claim 1, wherein said transparent insulating substrate is selected from a group consisting of $Al_2O_3$, $LiGaO_2$, $LiAlO_2$ and $MgAl_2O_4$.

4. A light emitting diode as recited in claim 1, wherein said GaN based contact layer is selected from a group consisting of AlGaN, GaN, and InGaN.

5. A light emitting diode, comprising:
a first conductivity type substrate;
a first conductivity type GaN as a first lower cladding layer directly over said substrate;
an InGaN light-emitting layer directly over said lower cladding layer;
a second conductivity type GaN as a second upper cladding layer directly over said InGaN light-emitting layer;
a GaN based contact layer with Gallium rich phase and thickness is between 5 Angstroms to 1000 Angstroms directly over said upper cladding layer;
an AlGaInSnO system transparent conducting oxide (TCO) as a light transmitting layer directly over said GaN based contact layer, and the thickness of this TCO thin film must over 5 Angstroms;
a first electrode formed underneath the first conductivity type substrate; and
a second electrode formed on top of the light transmitting layer.

6. A light emitting diode as recited in claim 5, wherein said transparent conducting oxide (TCO) has the composition:

$$Al_xGa_{3-x-y}In_{5+y}Sn_{2-z}O_{16-2z},$$

Where $0 \leq x < 2$, $0 < y < 3$, $0 \leq z < 2$.

7. A light emitting diode as described in claim 5, wherein said conductivity type substrate is selected from a group consisting of SiC, Si, ZnSe, GaAs, GaP, GaN and AlN.

8. A light emitting diode as described in claim 5, wherein said GaN based contact layer is selected from a group consisting of AlGaN, GaN, and InGaN.

9. A light emitting diode, comprising:
a transparent insulating substrate;
a first conductivity type GaN as a first lower cladding layer directly over said transparent insulating substrate;
an InGaN light-emitting layer directly over said lower cladding layer;
a second conductivity type GaN as second upper cladding layer directly over said InGaN light-emitting layer;
an AlGaInN system intermediate layer directly over said upper cladding layer, with material band-gap energy is lower than the second conductivity type GaN and thickness is between 5 Angstroms to 500 Angstroms;
a GaN based contact layer with Gallium rich phase and thickness is between 5 Angstroms to 1000 Angstroms directly over said intermediate layer;
an AlGaInSnO system transparent conducting oxide (TCO) as a light transmitting layer directly over said GaN based contact layer, and the thickness of this TCO thin film must over 5 Angstroms;
a first electrode formed on the partially exposed area of the first conductivity type GaN; and
a second electrode formed on top of the light transmitting layer.

10. A light emitting diode as recited in claim 9, wherein said transparent conducting oxide (TCO) has the composition:

$$Al_xGa_{3-x-y}In_{5+y}Sn_{2-z}O_{16-2z},$$

Where $0 \leq x < 2$, $0 < y < 3$, $0 \leq z < 2$.

11. A light emitting diode as recited in claim 9, wherein said transparent insulating substrate is selected from a group consisting of $Al_2O_3$, $LiGaO_2$, $LiAlO_2$ and $MgAl_2O_4$.

12. A light emitting diode as recited in claim 9, wherein said GaN based contact layer is selected from a group consisting of AlGaN, GaN, and InGaN.

13. A light emitting diode as recited in claim 9, wherein said intermediate layer is selected from a group consisting of AlGaInN, InGaN, and InN.

14. A light emitting diode, comprising:
a transparent insulating substrate;
a first conductivity type GaN as a first lower cladding layer directly over said transparent insulating substrate;
an InGaN light-emitting layer directly over said lower cladding layer;
a second conductivity type GaN as second upper cladding layer directly over said InGaN light-emitting layer;
a GaN based contact layer with Gallium rich phase and thickness is between 5 Angstroms to 1000 Angstroms directly over said upper cladding layer;
an AlGaInSnO system transparent conducting oxide (TCO) as a light transmitting layer directly over said GaN based contact layer, and the thickness of this TCO thin film must over 5 Angstroms;
a transparent conducting oxide window layer directly over said light transmitting layer;
a first electrode formed on the partially exposed area of the first conductivity type GaN; and
a second electrode formed on top of the transparent conducting oxide window layer.

15. A light emitting diode as recited in claim 14, wherein said transparent conducting oxide (TCO) has the composition:

$$Al_xGa_{3-x-y}In_{5+y}Sn_{2-z}O_{16-2z},$$

Where $0 \leq x < 2$, $0 < y < 3$, $0 \leq z < 2$.

16. A light emitting diode as recited in claim 14, wherein said transparent insulating substrate is selected from a group consisting of $Al_2O_3$, $LiGaO_2$, $LiAlO_2$ and $MgAl_2O_4$.

17. A light emitting diode as recited in claim 14, wherein said GaN based contact layer is selected from a group consisting of AlGaN, GaN, and InGaN.

18. A light emitting diode as recited in claim 14, wherein said transparent conducting oxide window layer is selected from a group consisting of $SnO_2$, $In_2O_3$, ITO, $Cd_2SnO_4$, ZnO, $CuAlO_2$, $CuCaO_2$, $SrCuO_2$, NiO, and $AgCoO_2$.

* * * * *